(12) United States Patent
Buchholz et al.

(10) Patent No.: US 12,181,535 B2
(45) Date of Patent: Dec. 31, 2024

(54) METHOD AND DEVICE FOR ESTIMATING THE USABLE CHARGE CAPACITY OF AN ELECTRICAL ENERGY STORE

(71) Applicant: Bayerische Motoren Werke Aktiengesellschaft, Munich (DE)

(72) Inventors: Bastian Buchholz, Munich (DE); Andreas Ertlmeier, Wolnzach (DE); Julian Wiesmeier, Deisenhofen (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 324 days.

(21) Appl. No.: 17/784,837

(22) PCT Filed: Nov. 25, 2020

(86) PCT No.: PCT/EP2020/083365
§ 371 (c)(1),
(2) Date: Jun. 13, 2022

(87) PCT Pub. No.: WO2021/121887
PCT Pub. Date: Jun. 24, 2021

(65) Prior Publication Data
US 2023/0009444 A1    Jan. 12, 2023

(30) Foreign Application Priority Data
Dec. 16, 2019   (DE) .............. 10 2019 134 436.0

(51) Int. Cl.
*G01R 31/392* (2019.01)
*G01R 31/367* (2019.01)
*G01R 31/396* (2019.01)

(52) U.S. Cl.
CPC ......... *G01R 31/392* (2019.01); *G01R 31/367* (2019.01); *G01R 31/396* (2019.01)

(58) Field of Classification Search
None
See application file for complete search history.

(56) References Cited

U.S. PATENT DOCUMENTS

| 2004/0008031 A1 | 1/2004 | Arai et al. |
| 2007/0152640 A1* | 7/2007 | Sasaki ................. B60L 58/15 320/150 |

(Continued)

FOREIGN PATENT DOCUMENTS

| DE | 103 21 720 A1 | 12/2003 |
| DE | 10 2010 019 128 B4 | 3/2019 |

(Continued)

OTHER PUBLICATIONS

International Search Report (PCT/ISA/210) issued in PCT Application No. PCT/EP2020/083365 dated Feb. 22, 2021 with English translation (five (5) pages).

(Continued)

*Primary Examiner* — Lina Cordero
(74) *Attorney, Agent, or Firm* — Crowell & Moring LLP

(57) ABSTRACT

A method for estimating the usable charge capacity of an electrical energy store includes determining a nominal initial charge capacity and a maximum initial estimation error of a new or slightly degraded energy store; determining one or more nominal charge capacities and one or more maximum estimation errors for the degraded energy store; interpolating a graph for the nominal charge capacity and for the maximum lower and upper estimation errors between the interpolation points of the nominal charge capacity and the interpolation points of the maximum estimation errors; and estimating a nominal charge state, a current usable charge capacity with a lower estimation reserve, and a current usable charge capacity with an upper estimation reserve for a current degradation state of the electrical energy store.

8 Claims, 2 Drawing Sheets

(56) References Cited

U.S. PATENT DOCUMENTS

| | | |
|---|---|---|
| 2011/0307033 A1 | 12/2011 | Michaels et al. |
| 2018/0050601 A1 | 2/2018 | Katanoda |
| 2019/0036356 A1 | 1/2019 | Subbaraman et al. |
| 2019/0113581 A1* | 4/2019 | Kawamura ............. B60L 58/12 |
| 2020/0094707 A1 | 3/2020 | Fukushima |

FOREIGN PATENT DOCUMENTS

| | | |
|---|---|---|
| DE | 11 2018 000 281 T5 | 10/2019 |
| DE | 11 2018 001 733 T5 | 12/2019 |
| EP | 3 438 683 A1 | 2/2019 |
| EP | 3 534 169 A2 | 9/2019 |
| JP | 2015-197428 A | 11/2015 |

OTHER PUBLICATIONS

German-language Written Opinion (PCT/ISA/237) issued in PCT Application No. PCT/EP2020/083365 dated Feb. 22, 2021 (nine (9) pages).

German-language Search Report issued in German Application No. 10 2019 134 436.0 dated Oct. 28, 2020 (12 pages).

\* cited by examiner

METHOD AND DEVICE FOR ESTIMATING THE USABLE CHARGE CAPACITY OF AN ELECTRICAL ENERGY STORE

BACKGROUND AND SUMMARY OF THE INVENTION

The present invention relates to a method and a device for estimating the usable charge capacity of an electrical energy store.

The electrical energy store of a vehicle, in both conventionally-powered motor vehicles having a combustion engine and in exclusively battery-powered vehicles, or battery electric vehicles (BEVs), and in plug-in hybrid vehicles (PHEVs), is a critical component, not only for vehicle comfort, but also for operational security and reliability, for general roadworthiness, and for the customer experience of the vehicle purchaser.

In conventionally-powered vehicles, for example, it must be ensured that specific safety-related electrical systems such as, for example, electric brake assist systems and steering systems, can continue to be reliably supplied by the electrical energy store for a specific time, in the event of the failure of the electric alternator during the operation of the vehicle. In conventionally-powered vehicles with an automatic start-stop function or an automatic engine start-up function (MSA), it must additionally be ensured that, further to a switch-off of the engine, a further engine start-up can be reliably executed using the residual charge which is present in the electrical energy store, or the switch-off of the engine must otherwise be omitted, and the start-stop function temporarily disabled, if the immobilization of the vehicle on the grounds of a deficient start-up capability is to be prevented.

To this end, prior to any switch-off of the engine, it is necessary to know the current state-of-health, or SOH, and the current state-of-charge, or SOC, of the electrical energy store, in order to estimate whether both the stored charge and the power supply capability, at a minimum voltage which must not be undershot, are sufficient to permit one or more start-up processes. Other factors come into play, including the current ambient temperature, the service temperature of the combustion engine, and the temperature-related viscosity of lubricants. Moreover, the magnitude of any voltage dip on the electrical energy store during the start-up process must not be such that the functional capability of safety-related control devices is temporarily lost, and restarting is required.

In exclusively battery-powered vehicles, the range of the vehicle with a full battery charge is a critical variable for the general driving capability, customer value and customer experience of a vehicle of this type. Firstly, the maximum achievable range with a full battery charge must be available for use in practice and, secondly, it must absolutely be avoided that, notwithstanding the indication of a residual range by the energy management system of a vehicle of this type, the vehicle is no longer capable of travel on the grounds that, in practice, the energy store is fully discharged.

In plug-in hybrid vehicles, the energy management system is ultimately required to identify the state-of-charge of the electrical energy store in a highly accurate and reliable manner, in order to permit the optimum planning and execution of the use of the plug-in/combustion engine unit, thus permitting the achievement of the maximum possible energy saving by way of the hybrid system. Depending upon road conditions, the driving program and the power take-up of further electrical loads in the on-board system, an overall positive charge balance and a consistently sufficient state-of-charge of the electrical energy store must be ensured.

The fulfilment of these requirements is handicapped, in that the current state-of-health and the current state-of-charge of an electrical energy store, together with the power supply capability and the minimum voltage thereof, cannot be accurately predicted, measured or calculated, but can only be estimated. In consequence, for reasons of safety and reliability, a certain buffer margin or estimation reserve is required, the correct dimensioning of which is subject to the dichotomy between an underestimation of the actual state-of-charge and a loss of available range.

It is moreover known that the maximum achievable state-of-charge $SOC_{old}$ of an electrical energy store which is already advanced in age, impaired or degraded no longer corresponds to the maximum achievable state-of-charge $SOC_{new}$ of the electrical energy store in its new state, but is dependent upon the current state-of-health SOH, in a manner which is complex and cannot be exactly described in mathematical terms. Accordingly, substantial efforts are devoted to the determination of the current state-of-health or current deterioration SOH, and the associated maximum achievable state-of-charge $SOC_{old}$, together with the associated relative current state-of-charge $SOC_{rel}$ of a degraded electrical energy store in the most reliable manner possible, and to the determination of the residual charging capacity.

From document EP 3 534 169 A2, the determination of a residual charge capacity of an electrical energy store is known, based upon a characteristic curve for the output voltage, plotted against the residual charge.

From document EP 3 438 683 A1, the estimation of a deterioration of an energy store is known, which employs a variation of the components of an equivalent electric circuit diagram of the energy store.

An object of the invention is the provision of a method and a device for estimating the usable charge capacity of an electrical energy store.

This object is fulfilled by a method, a device and a vehicle according to the claims.

A first aspect of the invention relates to a method for estimating the usable charge capacity of an electrical energy store, comprising: (a) the determination of a nominal initial charge capacity and a maximum initial estimation error of a new or slightly degraded energy store; (b) the determination of one or more nominal charge capacities and one or more maximum estimation errors for the degraded energy store; (c) the interpolation of a characteristic for the nominal charge capacity and for the maximum lower and upper estimation errors between the interpolation points of the nominal charge capacity and the interpolation points of the maximum estimation error; (d) the estimation of a nominal state-of-charge and a current usable charge capacity with a lower estimation reserve, and a current usable charge capacity with an upper estimation reserve for a current degradation state of an energy store.

An embodiment of the invention provides an advantage in that, in the estimation of the usable charge capacity of a new or slightly degraded electrical energy store, not only the higher nominal initial charging capacity, but also a higher accuracy of estimation are taken into consideration. Accordingly, for a new energy store, a larger proportion of the actual charge capacity can be employed, and a longer range achieved.

Conversely, for a degraded energy store, the estimation reserve is enlarged and adjusted to the lower accuracy of estimation, such that any overestimation of the residual range is prevented. Accordingly, an advantageous balance is achieved between an improved exploitation of the range of a new or slightly degraded electrical energy store, on the one hand, and a reliable estimation of the residual range of a degraded energy store, on the other.

In a preferred embodiment, interpolation for two interpolation points is executed in a linear manner and, for more than two interpolation points, in a sectionally linear manner. This provides the advantage of a simple determination of the nominal charge capacity and the maximum estimation error, which is nevertheless adaptable to the number of interpolation points available, from which the current usable charge capacity can be derived, with a lower and an upper estimation reserve.

In a further preferred embodiment, interpolation for two interpolation points is executed in a linear manner and, for more than two interpolation points, by way of a regression curve defined by the least squares method. This provides the advantage of a quadratic minimization of deviations between interpolation points which are defined by measurements and the regression curves. Measured interpolation points can incorporate measuring errors and fluctuations, which can be optimally eliminated by quadratic regression, if a linear degradation of the nominal charge capacity and estimation errors is assumed.

In a further preferred embodiment, interpolation for two interpolation points is executed by way of a typical model curve for the electrical energy store and, for more than two interpolation points, by way of a connecting curve or a regression curve, which connects the interpolation points or which minimizes the sum of the deviation squares of interpolation points. This provides an advantage, in that a non-linear regression curve can be identified by parameterization, which provides an optimum description of the unknown relationship between interpolation points. A typical model curve can be identified in the laboratory, in the form of a typical characteristic curve for the nominal charge capacity and estimation error plotted against the degradation of an electrical energy storage system, for example by the application of a square root law or the Arrhenius law. A connecting curve can be a non-linear connecting curve of a sufficient order number for the interconnection of a corresponding number of interpolation points, and for the accurate modelling of the mathematically unknown relationship between interpolation points.

In a further preferred embodiment, for the interpolation of the usable charge capacity and the maximum estimation error, a knowledge-based system or a neural network is employed, which is trainable by way of known degradation states, known charge capacities and thus associated estimation errors of an electrical energy store. The method is thus adaptable to different energy store technologies having different charge capacity characteristics and estimation error characteristics.

In a further preferred embodiment, individual interpolation points or the overall characteristic of the nominal charge capacity and the maximum lower and upper estimation errors for a specific energy store are plotted and/or preset, and/or are adjusted and/or expanded in the course of degradation. This provides an advantage, in that the estimation method is delivered in a basic embodiment, and can be incrementally improved and adjusted thereafter.

A second aspect of the invention relates to a device for executing the method according to one of the preceding claims, having circuits for the monitoring of energy storage cells, a battery management system and an indicator system for indicating a current usable charge capacity and/or a current degradation state and/or a residual service life of an energy store. This provides an advantage, in that a forthcoming replacement of the electrical energy store, in conjunction with the servicing of the vehicle, can be identified in due time.

A third aspect of the invention relates to a vehicle having a device of this type.

Features and advantages described with reference to the first aspect of the invention, and the advantageous configuration thereof, also apply, insofar as this is technically relevant, to the second and third aspects of the invention and advantageous configurations thereof.

Further features, advantages and potential applications of the invention proceed from the following description, in conjunction with the figures.

DETAILED DESCRIPTION OF THE DRAWINGS

Figure 1:
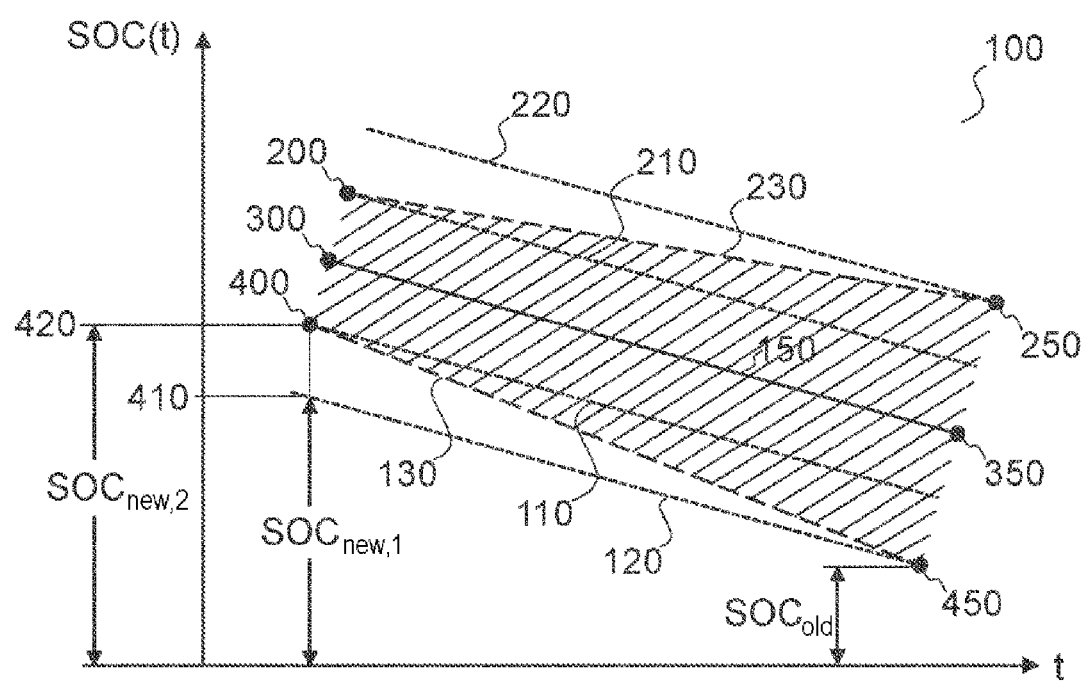
FIG. 1 shows an exemplary embodiment of the method, with reference to a diagram SOC(t).

FIG. 1 shows a diagram 100 for the illustration of an exemplary embodiment of the method according to the invention for estimating the usable charge capacity of an electrical energy store. During the service life of an electrical energy store, the nominal initial charge capacity 300, represented by the nominal maximum achievable state-of-charge SOC(t) of a new or slightly degraded energy store plotted against the operating time t, declines and, further to a degree of degradation, achieves an impaired and degraded nominal charge capacity 350. In the exemplary embodiment represented here, the characteristic of the nominal maximum achievable state-of-charge SOC(t) 150 is linear. In other exemplary embodiments, a different characteristic may be present. In particular, exemplary embodiments having a piecewise linear or non-linear characteristic are known. Additionally, it is also possible for only individual interpolation points to be known, for example by way of measurements, which are interpolated by way of linear, piecewise linear or non-linear characteristic curves.

However, the aging and degradation of an electrical energy store may not only result in a decline in the nominal maximum achievable state-of-charge SOC(t) 150, but also in an impaired estimability of the nominal charge capacity and the nominal maximum achievable state-of-charge. The actual decline in the nominal maximum achievable state-of-charge SOC(t) 150 in the course of the service life of the energy store is thus compounded by an increase in the inaccuracy of estimation which, in the case of a new or slightly degraded energy store, by way of approximation, commences with a relatively low maximum initial estimation error 200, 400 but which, due to aging and degradation, increases with the operating time t and, in the case of an older and more severely degraded energy store, by way of approximation, is expressed by a greater maximum estimation error 250, 450. With a specific probability, the estimation error lies between a maximum lower estimation error 130 and a maximum upper estimation error 230, in the shaded region of FIG. 1.

In consequence, the actual maximum achievable state-of-charge SOC(t) can lie between a lower estimation limit 130 and an upper estimation limit 230. In the present exemplary embodiment, the estimation limits 130, 230 are also linear but, in the same way as the nominal maximum achievable state of charge SOC(t) 150, can be represented by piecewise linear or non-linear characteristics, or by individual interpolation points, between which interpolation is required.

Inaccuracy of estimation requires a dynamic estimation reserve 130, 230, which increases in relation to the nominal maximum achievable state-of-charge SOC(t) 150 over the operating time t, and the consideration of which is essential to the energy management of the vehicle, if the actual maximum achievable state-of-charge SOC(t) of the electrical energy store is not to be over-estimated and the vehicle thus rendered unroadworthy, while the energy management system continues to indicate a residual range. Accordingly, in each degradation state of the energy store, the current usable charge capacity must be supplemented by a lower estimation reserve 130 and an upper estimation reserve 230.

The lower estimation reserve 110 for a new or slightly degraded energy store would not be sufficient for an energy store which is further degraded, whereas the lower estimation reserve 120 for a more degraded energy store would be too great for a new or slightly degraded energy store. In consequence, a constant estimation reserve over the duration of service life should consistently be tailored to the maximum state-of-charge $SOC_{old}$ 450 of the older and correspondingly more degraded energy store which is still achievable. Correspondingly, an excessively low range estimation for a vehicle having a new or slightly degraded energy store should be accepted, and an excessively low maximum achievable state-of-charge $SOC_{new,1}$ 410 applied. However, an accurate range estimation is of considerable significance for a battery-powered vehicle, both with respect to roadworthiness and with respect to the exploitation of available range such that, in the case of a new or slightly degraded energy store, the estimation of the actual maximum achievable state-of-charge $SOC_{new,2}$ 420 should also be executed.

By way of a dynamic estimation reserve 130, 230, the range associated with a new or slightly degraded energy store increases from $SOC_{new,1}$ 410 to $SOC_{new,2}$ 420. Accordingly, in the course of driving operation and on the basis of experience, depending upon the technology of the energy store employed, improvements in range of between 2 and 10% can be achieved.

The estimation method 100 can be implemented in a control device, particularly in a battery control device, and executed in the vehicle. The additional complexity of computing required for this purpose, in the case of linear interpolation, is limited, although somewhat greater in the case of non-linear regression. The employment of a neural network for the execution of the estimation method is advantageous, by way of which slow variations in the estimation curves can be learned in the course of driving operation. As a result, subsequent adjustments can be incorporated in the estimation method by a self-learning process.

Figure 2:
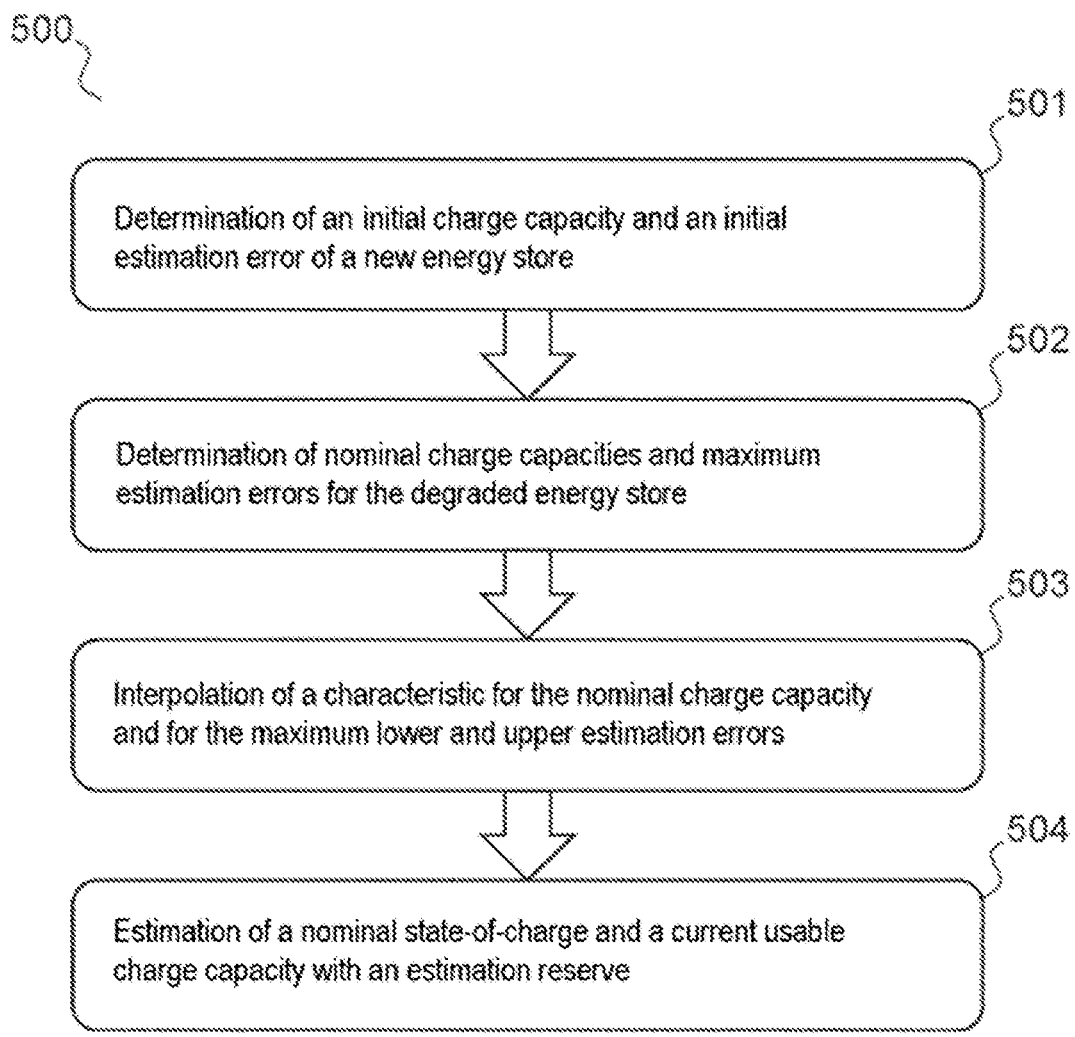
FIG. 2 shows an exemplary embodiment of the method, with reference to a flow diagram.

FIG. 2 shows a flow diagram for an exemplary embodiment of the method 500, having the process steps 501, 502, 503, 504.

LIST OF REFERENCE SYMBOLS

100 Estimation method
110 Lower estimation reserve, maximum lower estimation error for a new energy store
120 Lower estimation reserve, maximum lower estimation error for a degraded energy store
130 Dynamic lower estimation reserve, dynamic lower estimation error
150 Nominal charge capacity SOC(t)
200 Maximum upper estimation error for a new energy store
210 Upper estimation reserve, maximum upper estimation error for a new energy store
220 Upper estimation reserve, maximum upper estimation error for a degraded energy store
230 Dynamic upper estimation reserve or dynamic upper estimation error
250 Maximum upper estimation error of a degraded energy store
300 Nominal charge capacity SOC(t) of a new energy store
350 Nominal charge capacity SOC(t) of a degraded energy store
400 Maximum lower estimation error of a new energy store
410 Estimation $SOC_{new,1}$ for a new energy store, with an excessively large estimation reserve
420 Estimation $SOC_{new,2}$ for a new energy store, with an appropriate estimation reserve
450 Maximum lower estimation error of a degraded energy store

What is claimed is:

1. A method for estimating a usable charge capacity of an electrical energy store, the method comprising:
determining a nominal initial charge capacity and a maximum initial estimation error of a new energy store or a degraded energy store;
determining one or more nominal charge capacities and one or more maximum estimation errors for the degraded energy store;
interpolating a characteristic of a nominal charge capacity and of maximum lower and upper estimation errors between interpolation points of the nominal initial charge capacity and the one or more nominal charge capacities, and interpolation points of the maximum initial estimation error and the one or more maximum estimation errors; and
estimating a nominal state-of-charge, a current usable charge capacity with a lower estimation reserve, and a current usable charge capacity with an upper estimation reserve for a current degradation state of the electrical energy store.

2. The method according to claim 1, wherein interpolation for two of the interpolation points is executed in a linear manner and, for more than two of the interpolation points, in a sectionally linear manner.

3. The method according to claim 1, wherein interpolation for two of the interpolation points is executed in a linear manner and, for more than two of the interpolation points, by way of a regression curve defined by a least squares method.

4. The method according to claim 1, wherein interpolation for two of the interpolation points is executed by way of a typical model curve for the electrical energy store and, for more than two of the interpolation points, by way of a connecting curve or a regression curve, which connects the interpolation points or which minimizes a sum of deviation squares of the interpolation points.

5. The method according to claim 1, wherein interpolation of the usable charge capacity and the one or more maximum estimation errors is executed by way of a knowledge-based system or a neural network, which is trainable by way of known degradation states, known charge capacities and thus associated estimation errors of the electrical energy store.

6. The method according to claim 1, wherein individual interpolation points or an overall characteristic of the nominal charge capacity and the maximum lower and upper estimation errors for the electrical energy store are plotted and/or preset, and/or are adjusted and/or expanded in a course of degradation.

7. A device comprising:
a processer configured to execute the method according to claim 1;
circuits configured to monitor energy storage cells;
a battery management system; and
an indicator system configured to indicate the current usable charge capacity, the current degradation state, and/or a residual service life of the electrical energy store.

8. A vehicle comprising the device according to claim 7.

* * * * *